(12) United States Patent
Yang et al.

(10) Patent No.: US 11,125,620 B2
(45) Date of Patent: Sep. 21, 2021

(54) SUBSTRATE FOR SENSING, A METHOD OF FABRICATING THE SUBSTRATE, AND ANALYZING APPARATUS INCLUDING THE SUBSTRATE

(71) Applicants: SAMSUNG ELECTRONICS CO., LTD., Suwon-si (KR); CALIFORNIA INSTITUTE OF TECHNOLOGY, Pasadena, CA (US)

(72) Inventors: Daejong Yang, Pasadena, CA (US); Hyunjun Cho, Pasadena, CA (US); Youngzoon Yoon, Hwaseong-si (KR); Hyuck Choo, Pasadena, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 166 days.

(21) Appl. No.: 15/989,983

(22) Filed: May 25, 2018

(65) Prior Publication Data

US 2018/0340830 A1  Nov. 29, 2018

Related U.S. Application Data

(60) Provisional application No. 62/510,917, filed on May 25, 2017.

(51) Int. Cl.
*B82Y 15/00* (2011.01)
*B82Y 30/00* (2011.01)
(Continued)

(52) U.S. Cl.
CPC ........ *G01J 3/4412* (2013.01); *B81C 1/00206* (2013.01); *B82Y 15/00* (2013.01);
(Continued)

(58) Field of Classification Search
CPC ........ G01J 3/4412; B82Y 15/00; B82Y 30/00; B81C 1/00206; B81C 2201/0104;
(Continued)

(56) References Cited

U.S. PATENT DOCUMENTS 7,384,792 B1  6/2008  Wang et al.
8,670,119 B1  3/2014  Bratkovski et al.
(Continued)

FOREIGN PATENT DOCUMENTS

EP  2 175 276 A2  4/2010
KR  10-1097205 B1  12/2011
(Continued)

OTHER PUBLICATIONS

Judith Langer et al, Sensing using plasmonic nanostructures and nanoparticles, 2015, Nanotechnology 26 322001 (Year: 2015).*
(Continued)

*Primary Examiner* — Nathan L Van Sell
(74) *Attorney, Agent, or Firm* — Sughrue Mion, PLLC

(57) ABSTRACT

A substrate for sensing, a method of manufacturing the substrate, and an analyzing apparatus including the substrate are provided. The substrate for sensing includes: a support layer; a plurality of metal nanoparticle clusters arranged on the support layer; and a plurality of perforations arranged among the plurality of metal nanoparticle clusters. The plurality of metal nanoparticle clusters each comprise a plurality of metal nanoparticles stacked in a three-dimensional structure. Each of the plurality of perforations transmits incident light therethrough.

9 Claims, 15 Drawing Sheets

(51) Int. Cl.
*G01J 3/44* (2006.01)
*G01N 21/65* (2006.01)
*B81C 1/00* (2006.01)
*C23C 18/06* (2006.01)
*C23C 18/08* (2006.01)

(52) U.S. Cl.
CPC .............. *B82Y 30/00* (2013.01); *C23C 18/06* (2013.01); *C23C 18/08* (2013.01); *G01N 21/658* (2013.01); *B81B 2203/0361* (2013.01); *B81B 2207/056* (2013.01); *B81C 2201/0104* (2013.01)

(58) Field of Classification Search
CPC ..... B81C 1/00031; C23C 18/06; C23C 18/08; G01N 21/658; B81B 2207/056; B81B 2203/0361; B81B 2201/0214
See application file for complete search history.

(56) References Cited

U.S. PATENT DOCUMENTS

| | | | |
|---|---|---|---|
| 8,711,351 | B1 | 4/2014 | Gibson et al. |
| 9,476,833 | B2 | 10/2016 | Barcelo et al. |
| 9,557,272 | B2 | 1/2017 | Suh et al. |
| 2006/0258132 | A1* | 11/2006 | Brown ................... B82Y 10/00 438/610 |
| 2010/0129623 | A1 | 5/2010 | Johansson et al. |
| 2010/0184451 | A1 | 7/2010 | Wang et al. |
| 2011/0116089 | A1 | 5/2011 | Schmidt et al. |
| 2011/0155649 | A1 | 6/2011 | Mazur et al. |
| 2011/0228266 | A1 | 9/2011 | Kuo et al. |
| 2011/0311822 | A1* | 12/2011 | Hao ................... A61K 49/0065 428/402.2 |
| 2012/0273662 | A1* | 11/2012 | Caldwell .............. G01N 21/658 250/214.1 |
| 2014/0000713 | A1* | 1/2014 | Kohen .................. B82Y 10/00 136/261 |
| 2018/0335387 | A1 | 11/2018 | Lee et al. |

FOREIGN PATENT DOCUMENTS

| | | |
|---|---|---|
| KR | 10-1448111 B1 | 10/2014 |
| KR | 10-2016-0122011 A | 10/2016 |
| WO | 2011/047690 A1 | 4/2011 |

OTHER PUBLICATIONS

Kim et al, Ultrahigh-Density Array of Silver Nanoclusters for SERS Substrate with High Sensitivity and Excellent Reproducibility, 2012, vol. 6, No. 1, 249-255 (Year: 2012).*

Jones et al, Templated Techniques for the Synthesis and Assembly of Plasmonic Nanostructures, 2011, Chem. Rev. 111, 3736-3738, 3779-3780 (Year: 2011).*

Communication dated Jul. 4, 2018, issued by the European Patent Office in counterpart European Application No. 18174331.1.

Greene, et al., "General Route to Vertical ZnO Nanowire Arrays Using Textured ZnO Seeds", Jun. 18, 2005, Nano Letters, vol. 5, No. 7, 6 pages total.

Kumar, et al., "Controlling the Size and Size Distribution of Gold Nanoparticles: A Design of Experiment Study", Mar. 28, 2012, International Journal of Nanoscience, vol. 11, No. 2, 8 pages total.

International Diabetes Federation, IDF Diabetes Atlas, 2015, Seventh Edition, 140 pages total.

Bloomgarden, Z., "Diabetes Complications", Jun. 2004, Diabetes Care, vol. 27., No. 6, 9 pages total.

Nie, S. and Emory, S., "Probing Single Molecules and Single Nanoparticles by Surface-Enhanced Raman Scattering", Feb. 21, 1997, Science, vol. 275, 6 pages total.

Zhang et al, "Large-scale uniform Au nanodisk arrays fabricated via x-ray interference lithography for reproducible and sensitive SERS substrate", May 23, 2014, Nanotechnology, vol. 25, 9 pages total.

* cited by examiner

SUBSTRATE FOR SENSING, A METHOD OF FABRICATING THE SUBSTRATE, AND ANALYZING APPARATUS INCLUDING THE SUBSTRATE

CROSS-REFERENCE TO RELATED APPLICATION

This application claims the benefit of U.S. Provisional Application No. 62/510,917, filed on May 25, 2017, in the United States Patent and Trademark Office, the disclosure of which is incorporated herein in its entirety by reference.

BACKGROUND

1. Field

Apparatuses and methods consistent with exemplary embodiments relate to a substrate for sensing, a method of manufacturing the substrate, and an analyzing apparatus including the substrate, and more particularly, to a surface-enhanced Raman scattering (SERS) substrate, a method of manufacturing a highly uniform SERS substrate with a wide area, and a biometric information analyzing apparatus including the SERS substrate.

2. Description of the Related Art

Raman spectroscopy may be used to analyze components of various materials by measuring the inelastic scattering which occurs inside an object due to an excitation by light incident on the object. When light is incident on a sample to be measured, inelastically scattered light, of a wavelength which is different from the wavelength of the incident light, can be detected and measured. The resultant wavelength shift between the incident light and the scattered light is referred to as a Raman shift, and this shift indicates the molecular vibrational or rotational energy state of the object. Since it is known that an intensity of Raman scattered light directly corresponds to the concentration of a target molecule, Raman spectroscopy is very useful for molecular analysis.

Particularly, since a surface-enhanced Raman scattering (SERS) phenomenon was discovered, in which the Raman signal of molecules adsorbed by a roughly surface-treated metal substrate increases significantly, the weakness of conventional Raman spectroscopy, which has a lower detection sensitivity due to the very small signal strength of Raman scattered light, has been improved. In order to clarify the principle of SERS, much research has been conducted. For example, it is predicted that, when a laser beam is incident on a metal, an excitation of surface plasmons is concentrated in a certain region according to the structure of the surface of the metal, thereby inducing SERS. In addition, it is also predicted that the electromagnetic interaction between the metal and molecules adsorbed by the metal contributes to SERS.

SUMMARY

According to an aspect of an exemplary embodiment, a substrate for sensing includes: a support layer; a plurality of metal nanoparticle clusters arranged on the support layer; and a plurality of perforations arranged among the plurality of metal nanoparticle clusters such that incident light is delivered from an upper portion of the plurality of metal nanoparticle clusters to a lower portion of the plurality of metal nanoparticle clusters, wherein each of the plurality of metal nanoparticle clusters includes a plurality of conductive metal nanoparticles stacked in a three-dimensional structure.

The support layer may be a semiconductor wafer.

The metal nanoparticles may include at least one conductive metal selected from gold (Au), silver (Ag), copper (Cu), and aluminum (Al).

The plurality of metal nanoparticle clusters may extend in a vertical direction from a surface of the support layer.

A thickness of the plurality of metal nanoparticle clusters may be 50 nm to 1 μm.

The plurality of perforations may extend to a surface of the support layer, such that incident light is transmitted therethrough to the surface of the support layer.

A mean diameter of the metal nanoparticles may be 10 nm to 20 nm.

A mean interval between adjacent ones of the plurality of metal nanoparticle clusters may be 8 nm to 20 nm.

According to an aspect of another exemplary embodiment, an analyzing apparatus includes the substrate for sensing.

According to an aspect of another exemplary embodiment, a method of manufacturing a substrate for sensing includes: forming a plurality of nanowires on a support layer; forming a plurality of metal nanoparticle clusters each including a plurality of conductive metal nanoparticles stacked in a three-dimensional structure, by depositing the plurality of conductive metal nanoparticles on surfaces of the plurality of nanowires; and forming a plurality of perforations among the plurality of metal nanoparticle clusters by at least partially removing the plurality of nanowires.

The plurality of nanowires may be formed of silicon (Si), indium phosphide (InP), gallium nitride (GaN), or zinc oxide (ZnO).

The forming of the plurality of nanowires may include: coating a seed layer of a nanowire material on the support layer; placing the support layer in a solution including a precursor of the nanowire material; and removing the support layer from the solution and heat-treating the support layer.

The forming of the plurality of metal nanoparticle clusters may include: a liquid phase deposition operation of placing the support layer having the plurality of nanowires formed thereon in a metal nanoparticle precursor solution and heating the metal nanoparticle precursor solution with the support layer therein; and a cleansing operation of cleansing the support layer.

The forming of the plurality of metal nanoparticle clusters may include repeating the liquid phase deposition operation a plurality of times.

The at least partially removing the plurality of nanowires may be performed during the liquid phase deposition operation.

The metal nanoparticle precursor solution may include a solvent for dissolving the plurality of nanowires.

The plurality of perforations may extend to a surface of the support layer, such that the plurality of perforations transmit incident light to the surface of the support layer.

According to an aspect of another exemplary embodiment, a method of manufacturing a substrate for sensing includes: partially removing a support layer material, thereby forming a support layer and a plurality of elements extending from a surface thereof, wherein the plurality of elements comprise one of a plurality of nanowires and a plurality of walls; forming a plurality of metal nanoparticle clusters each including a plurality of conductive metal nanoparticles stacked in a three-dimensional structure, by depositing the plurality of conductive metal nanoparticles on surfaces of the plurality of elements; and forming a plurality of perforations among the plurality of metal nanoparticle clusters by at least partially removing the plurality of elements.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1A:
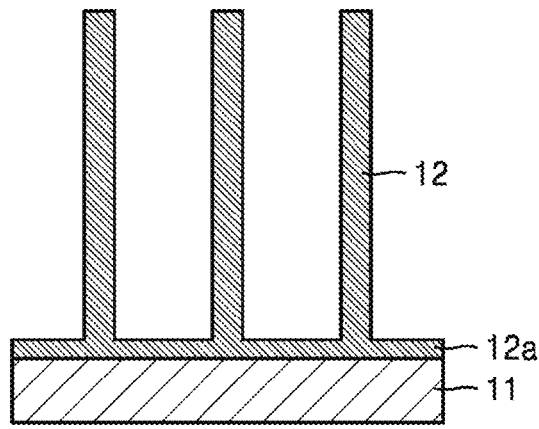
FIGS. 1A to 1E are schematic cross-sectional views illustrating a process of manufacturing a substrate for sensing, according to an exemplary embodiment.

Hereinafter, exemplary embodiments of a substrate for sensing, a method of manufacturing the substrate, and an analyzing apparatus including the substrate are described in detail with reference to the accompanying drawings. In the drawings, like reference numerals refer to like elements, and the sizes of components may be exaggerated for convenience and clarity of description. In addition, the exemplary embodiments to be described below are only illustrative, and various modifications may be made from the exemplary embodiments. In addition, in a layer structure to be described below, the expression "on an upper part of" or "on" may include the meaning of not only located directly on/under/left/right but also located indirectly on/under/left/ right.

As used herein, the term "and/or" includes any and all combinations of one or more of the associated listed items. Expressions such as "at least one of," when preceding a list of elements, modify the entire list of elements and do not modify the individual elements of the list.

FIGS. 1A to 1E are schematic cross-sectional views illustrating a process of manufacturing a substrate for sensing, according to an exemplary embodiment.

Referring to FIG. 1A, a plurality of nanowires 12 may be formed on a support layer 11. The support layer 11 may be a semiconductor wafer used in a general semiconductor manufacturing process. For example, the support layer 11 may be a semiconductor wafer formed of silicon (Si), germanium (Ge), gallium arsenide (GaAs), gallium phosphide (GaP), or the like.

The plurality of nanowires 12 may extend vertically from the support layer 11. The nanowires 12 may be formed of a material which is removable in post-processing or does which does not affect Raman scattering even if the material is not removed. For example, the nanowires 12 may be formed of a material such as Si, indium phosphide (InP), gallium nitride (GaN), zinc oxide (ZnO), or the like.

The nanowires 12 may be formed by coating a seed layer 12a of a nanowire material on the support layer 11, disposing the support layer 11 in a solution including a precursor of the nanowire material, pulling the support layer 11 from the solution, and then heat-treating the support layer 11.

For example, when the nanowires 12 are to be ZnO nanowires, a ZnO seed solution including 5 mM-concentration of zinc acetate dihydrate dissolved in ethanol is coated on the support layer 11. Thereafter, the support layer 11 and the ZnO seed solution are heat-treated on a hot plate at a temperature of about 350° C. for about 20 minutes such that the seed layer 12a clearly adheres onto the support layer 11. Thereafter, the support layer 11 is immersed in a ZnO precursor solution, and the support layer 11 is heated in a convection oven at a temperature of about 95° C. for about 2.5 hours. For example, the ZnO precursor solution may be a solution including zinc nitrate hexahydrate of a 25 mM concentration, hexamethylenetetramine (HMTA) of a 25 mM concentration, and poly ether imide (PEI) of a 5 mM concentration in de-ionized (DI) water. Thereafter, when the support layer 11 is pulled from the ZnO precursor solution, the ZnO precursor solution remaining on the support layer 11 is cleansed out by using DI water, the support layer 11 is heat-treated on a hot plate at a temperature of about 350° C. for about 20 minutes, and the ZnO nanowires may be formed on the support layer 11. Alternately, the nanowires 12 may be formed by any of various other methods.

Figure 1B:
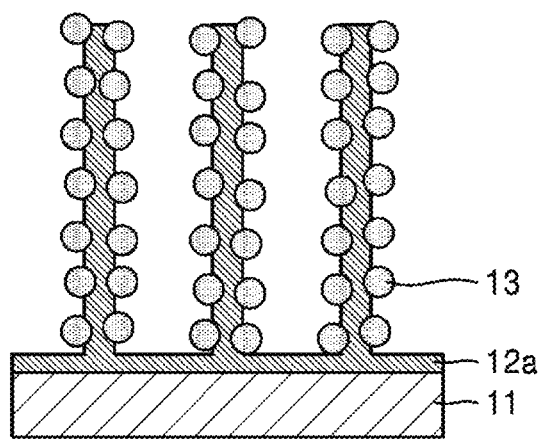
Figure 1C:
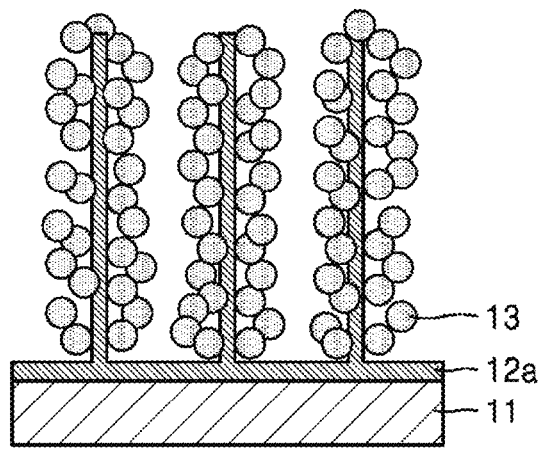
Figure 1D:
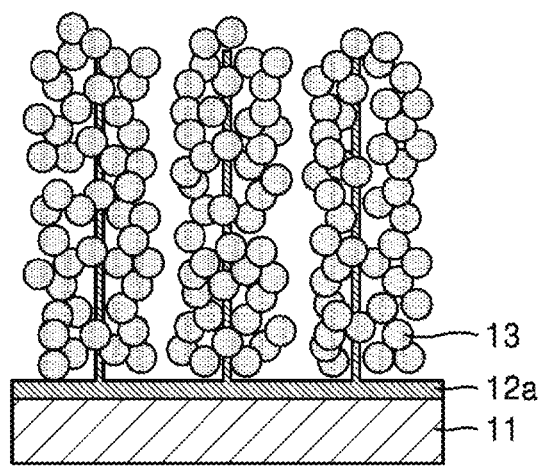
Figure 1E:
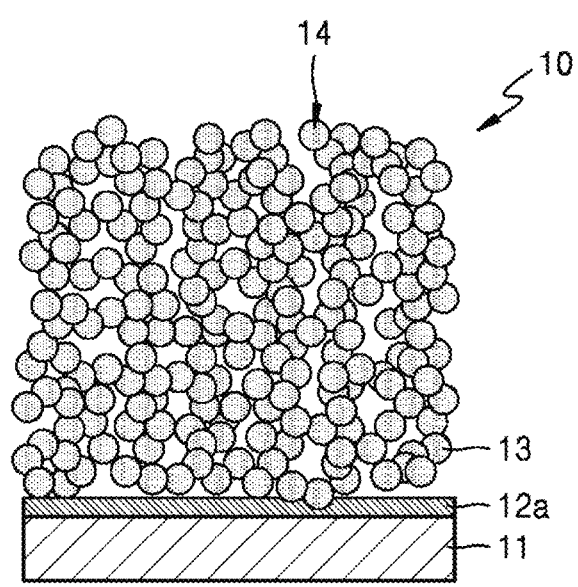

Referring to FIG. 1B, a plurality of conductive metal nanoparticles 13 may be stacked in a three-dimensional structure by depositing the plurality of conductive metal nanoparticles 13 on surfaces of the plurality of nanowires 12. The metal nanoparticles 13 may include a metal having good conductivity, for example, gold (Au), silver (Ag), copper (Cu), and aluminum (Al). In addition, as shown in FIG. 1E, a plurality of metal nanoparticle clusters 14 including a plurality of conductive metal nanoparticles 13 stacked in a three-dimensional structure may be formed by repeating the operation of depositing the plurality of conductive metal nanoparticles 13 on surfaces of the plurality of nanowires 12, as shown in FIGS. 1C to 1E.

For example, the plurality of metal nanoparticle clusters 14 may be formed by a liquid phase deposition method of immersing the support layer 11, having the plurality of nanowires 12 formed thereon, in a metal nanoparticle precursor solution and heating the same. In more detail, the support layer 11 having the plurality of nanowires 12 formed thereon is immersed in a metal nanoparticle precursor solution, and the metal nanoparticle precursor solution may be heated in a convection oven at a temperature of about 90° C. for about one hour. This liquid phase deposition operation may be repeated a plurality of times until a plurality of conductive metal nanoparticles 13 are concentrated to form the metal nanoparticle clusters 14. A mean diameter of the metal nanoparticles 13 formed by the liquid phase deposition operation may be, for example, 10 nm to 20 nm.

Figure 2A:
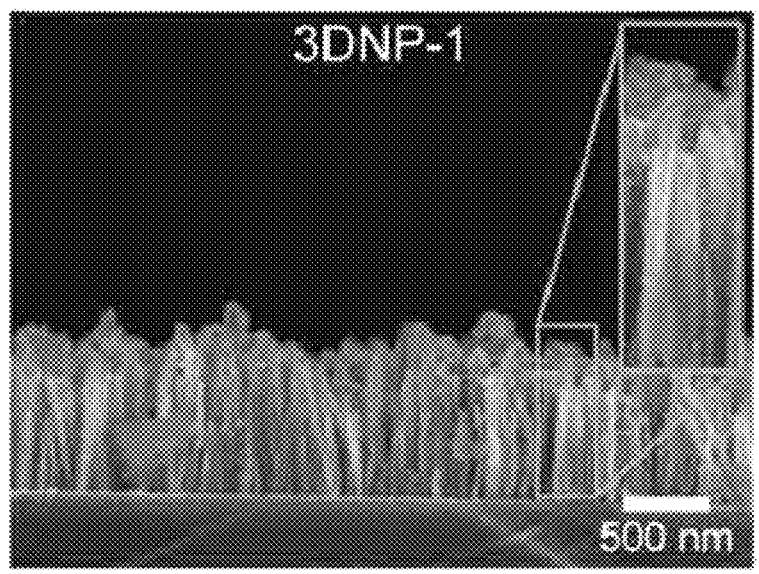
FIG. 2A illustrates a scanning electron microscope (SEM) image of metal nanoparticles deposited on a nanowire in the operation shown in FIG. 1B.
Figure 2B:
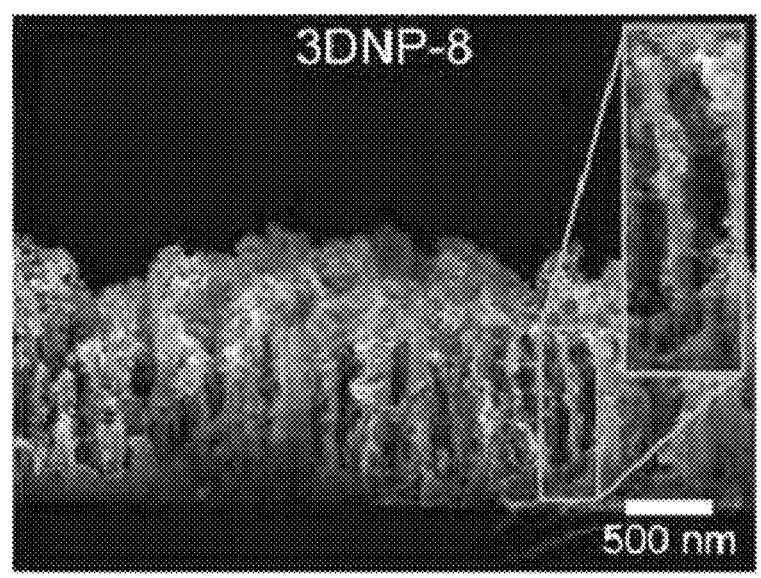
FIG. 2B illustrates an SEM image of metal nanoparticles stacked in a three-dimensional structure in the operation shown in FIG. 1E.

For example, FIG. 2A illustrates a scanning electron microscope (SEM) image of metal nanoparticles 13 deposited on nanowires 12, as shown in the operation of FIG. 1B. Referring to FIG. 2A, the metal nanoparticles 13 are deposited on surfaces of the nanowires 12 at a relatively low density. In addition, FIG. 2B illustrates an SEM image of metal nanoparticles 13 stacked in three-dimensional structures, as shown in the operation of FIG. 1E. For example, FIG. 2B illustrates a case in which the liquid phase deposition operation described above is repeated eight times. Referring to FIG. 2B, metal nanoparticle clusters 14 are formed by very densely depositing a plurality of metal nanoparticles 13.

As the liquid phase deposition operation is repeated, the nanowire 12 may gradually dissolve and disappear due to an acidic component of the metal nanoparticle precursor solution. Alternatively, a solvent for dissolving the nanowires 12 may be intentionally included in the metal nanoparticle precursor solution. Referring to FIG. 2B, when the liquid phase deposition operation is repeated eight times, only the metal nanoparticle clusters 14 remain, and the nanowires 12 have almost entirely disappeared.

Figure 3:
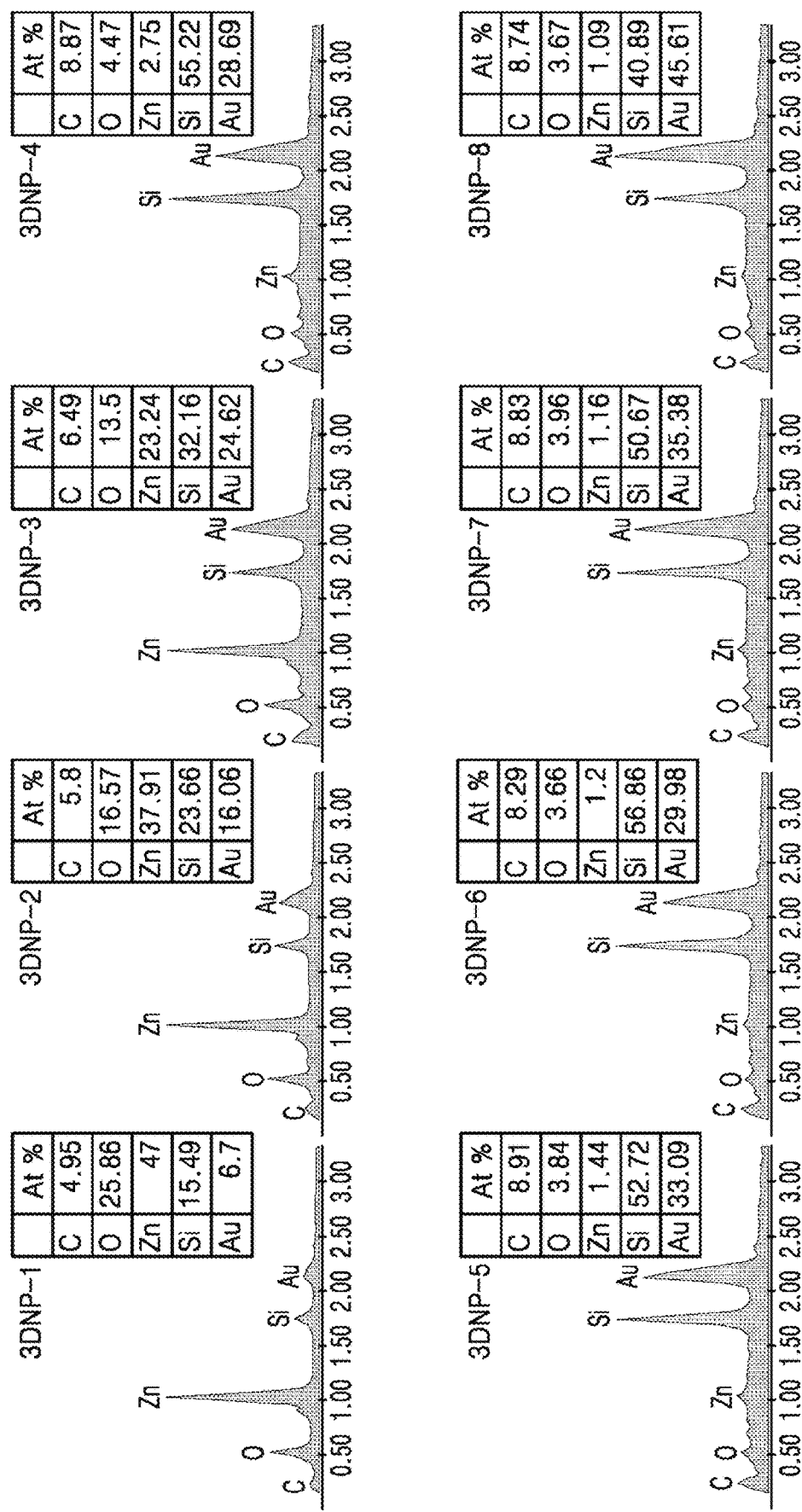
FIG. 3 illustrates energy dispersive spectrometry (EDS) data showing a change in components of a substrate for sensing according to the number of depositions of metal nanoparticles.
Figure 4:
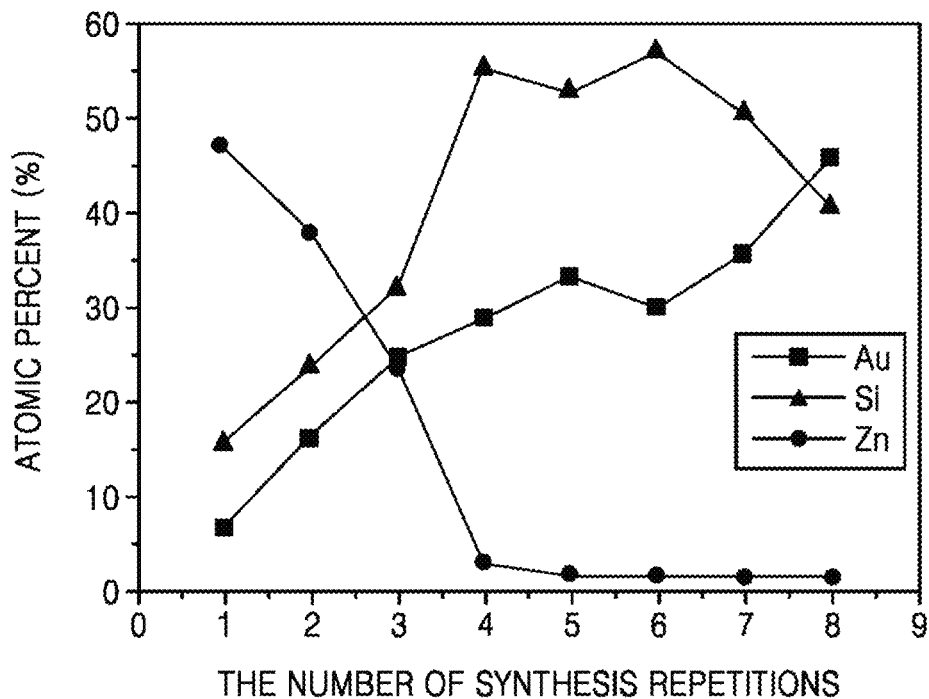
FIG. 4 is a graph showing a change in components of a substrate for sensing according to the number of depositions of metal nanoparticles.

For example, FIG. 3 illustrates energy dispersive spectrometry (EDS) data showing a change in components of a substrate for sensing according to the number of depositions of metal nanoparticles 13, and FIG. 4 is a graph showing the same. In the example of FIGS. 3 and 4, Si is used for the support layer 11, ZnO is used for the nanowires 12, and Au is used for the metal nanoparticles 13. Referring to FIGS. 3 and 4, in initial stages, a Zn component is almost 50 at %, and an Au component comprises the least at %. However, as the number of depositions increases, the Zn component gradually decreases, and Si and Au components gradually increase. When the number of depositions is eight, the Zn component has almost disappeared, and the Au component comprises the greatest at %.

Finally, the support layer 11 having the metal nanoparticle cluster 14 formed thereon may be cleansed. For example, salt and carbon compounds remaining on the substrate for sensing may be removed by being cleansed with DI water and ethanol. Then, a substrate 10 for sensing having the plurality of metal nanoparticle clusters 14 densely arranged on the support layer 11 may be completed.

Although it has been described that the metal nanoparticle clusters 14 are formed by a liquid phase deposition method, this is only exemplary. Alternately, for example, besides the liquid phase deposition method, the metal nanoparticle cluster 14 may be formed by depositing metal nanoparticles 13 on the surface of the nanowire 12 by sputtering or evaporation. In this case, the nanowire 12 remaining on the support layer 11 may be removed through a separate process. For example, the nanowires 12 remaining on the support layer 11 may be at least partially removed, and then the support layer 11 may be cleansed.

Figure 5:
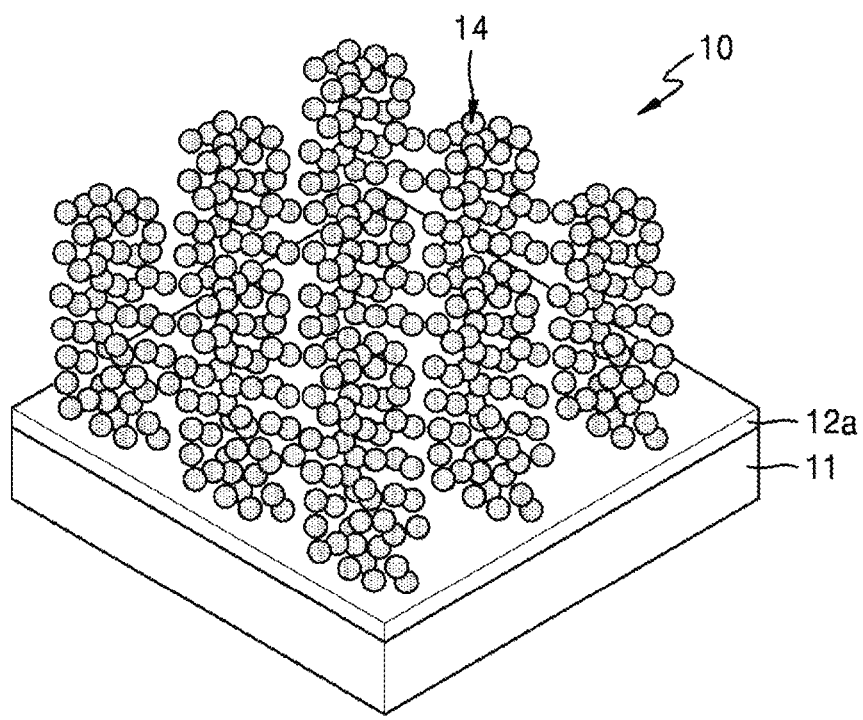
FIG. 5 is a perspective view showing a schematic configuration of a substrate for sensing, according to an exemplary embodiment.

FIG. 5 is a perspective view showing a schematic configuration of a substrate 10 for sensing, according to an exemplary embodiment, and referring to FIG. 5, a plurality of metal nanoparticle clusters 14 may be densely, three-dimensionally arranged on the support layer 11. Each metal nanoparticle cluster 14 may include a plurality of conductive metal nanoparticles 13 stacked in a three-dimensional structure. As described above, a plurality of conductive metal nanoparticles 13 are densely formed on the surface of a nanowire 12, and the plurality of conductive metal nanoparticles 13 formed on the surface of one nanowire 12 form one metal nanoparticle cluster 14. The plurality of metal nanoparticle clusters 14 each extend in a vertical direction with respect to a surface of the support layer 11. Meanwhile, the seed layer 12a of the nanowire material may at least partially remain on the surface of the support layer 11.

Figure 6:
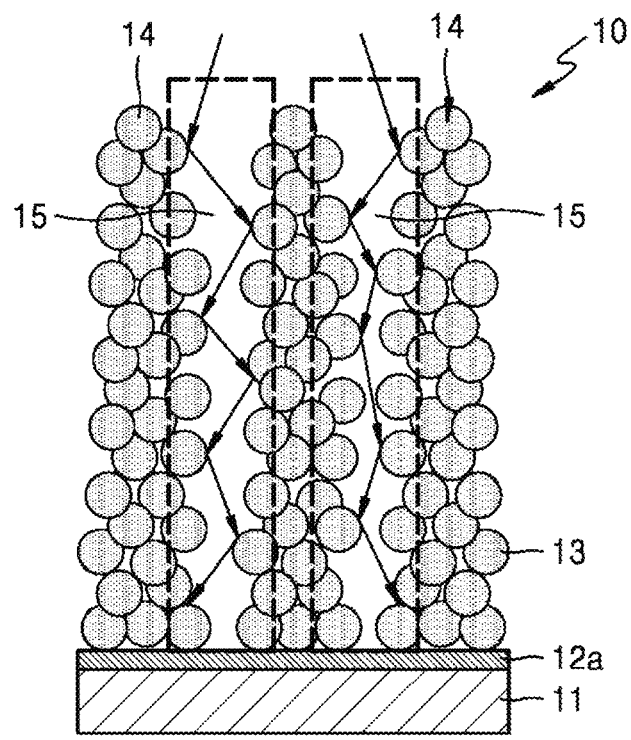
FIG. 6 is a cross-sectional view showing a schematic configuration of a substrate for sensing, according to an exemplary embodiment.

In addition, FIG. 6 is a cross-sectional view showing a schematic configuration of a substrate 10 for sensing, according to an exemplary embodiment. Referring to FIG. 6, the substrate 10 for sensing may include a plurality of fine perforations 15 which are openings which remain between adjacent ones of the plurality of metal nanoparticle clusters 14 upon removal of the nanowires 12. The plurality of fine perforations 15, through which light may pass may be, for example, spaces remaining in positions where the plurality of nanowires 12 have been dissolved. As discussed above, as the plurality of conductive metal nanoparticles 13 formed on the surface of a nanowire 12 increase to form a metal nanoparticle cluster 14, the nanowire 12 is gradually dissolved, thereby leaving a plurality perforation 15.

The plurality of perforations 15 allow light to be transmitted from an upper part of the plurality of metal nanoparticle clusters 14 to a lower part thereof. As shown in FIG. 6, light incident on an upper part of the substrate 10 for sensing may be transmitted along the perforations 15 between the metal nanoparticle clusters 14 and may thereby reach the bottom of the substrate 10 for sensing. In other words, light may reach the surface of the support layer 11 by being transmitted between the metal nanoparticle clusters 14 via the perforations 15. In this way, as the light is transmitted along a relatively long, three-dimensionally formed path, the light may excite a large number of conductive metal nanoparticles 13 located between an upper part of a metal nanoparticle cluster 14 and a lower part thereof. Therefore, the substrate 10 for sensing according to the present exemplary embodiment may further increase a surface-enhanced effect. Since the substrate 10 for sensing according to the present exemplary embodiment sufficiently absorbs light through the perforations 15 among the metal nanoparticle clusters 14, the substrate 10 for sensing has a good light use efficiency and may appear as an almost perfect black color.

Figure 7:
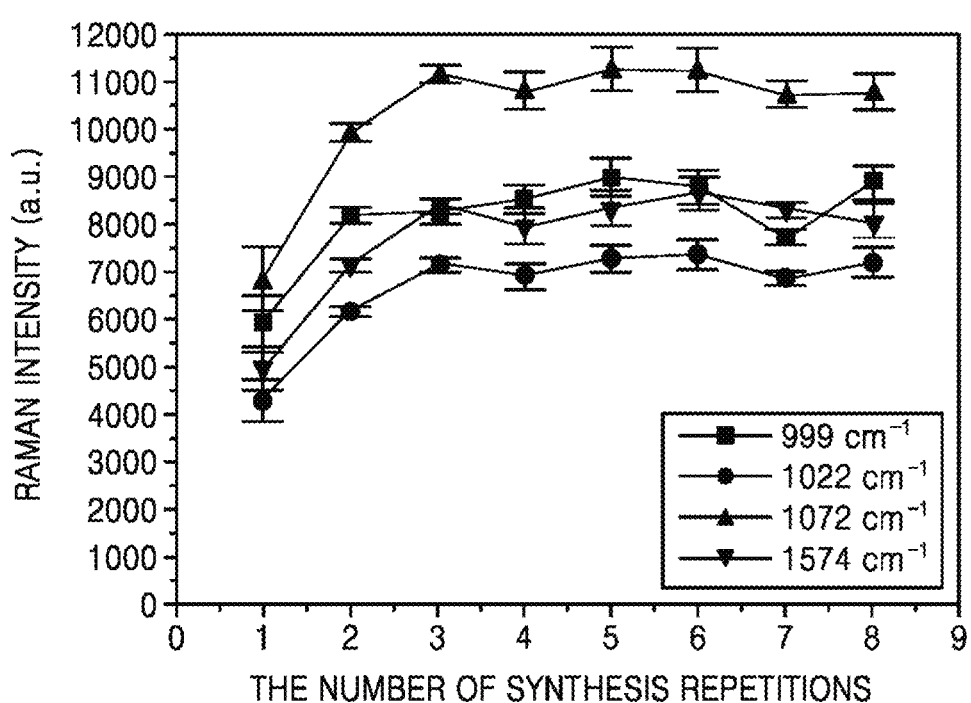
FIG. 7 is a graph showing, for different wavenumbers, an intensity of Raman scattered light according to the number of depositions of metal nanoparticles in a substrate for sensing, according to an exemplary embodiment.

The surface-enhanced effect of the substrate 10 for sensing according to the present exemplary embodiment may vary according to a density of conductive metal nanoparticles 13. FIG. 7 is a graph, for different wavenumbers, of the intensity of Raman scattered light according to the number of depositions of metal nanoparticles 13 in a substrate 10 for sensing, according to an exemplary embodiment. For example, a liquid phase deposition, including immersing the support layer 11 having nanowires 12 formed thereon in a metal nanoparticle precursor solution and heating the metal nanoparticle precursor solution in a convection oven at a temperature of about 90° C. for about one hour, is performed eight times. Intensities of Raman scattered light for wavenumbers of about 999 $cm^{-1}$, 1022 $cm^{-1}$, 1072 $cm^{-1}$, 1574 $cm^{-1}$ are measured from the substrate 10 for sensing after each liquid phase deposition operation is performed. The measurement is performed by using 1 nM benzenethiol as a sample solution, using a 0.07 mW laser having a wavelength of 785 nm as a light source, and using Au as the metal nanoparticles 13. Referring to the graph of FIG. 7, the intensity of Raman scattered light rapidly increases up to the third deposition for most wavenumbers, and thereafter, the intensity of Raman scattered light is maximized at the fifth deposition. Therefore, the surface-enhanced effect is almost saturated between the third deposition and the eighth deposition.

Figure 8:
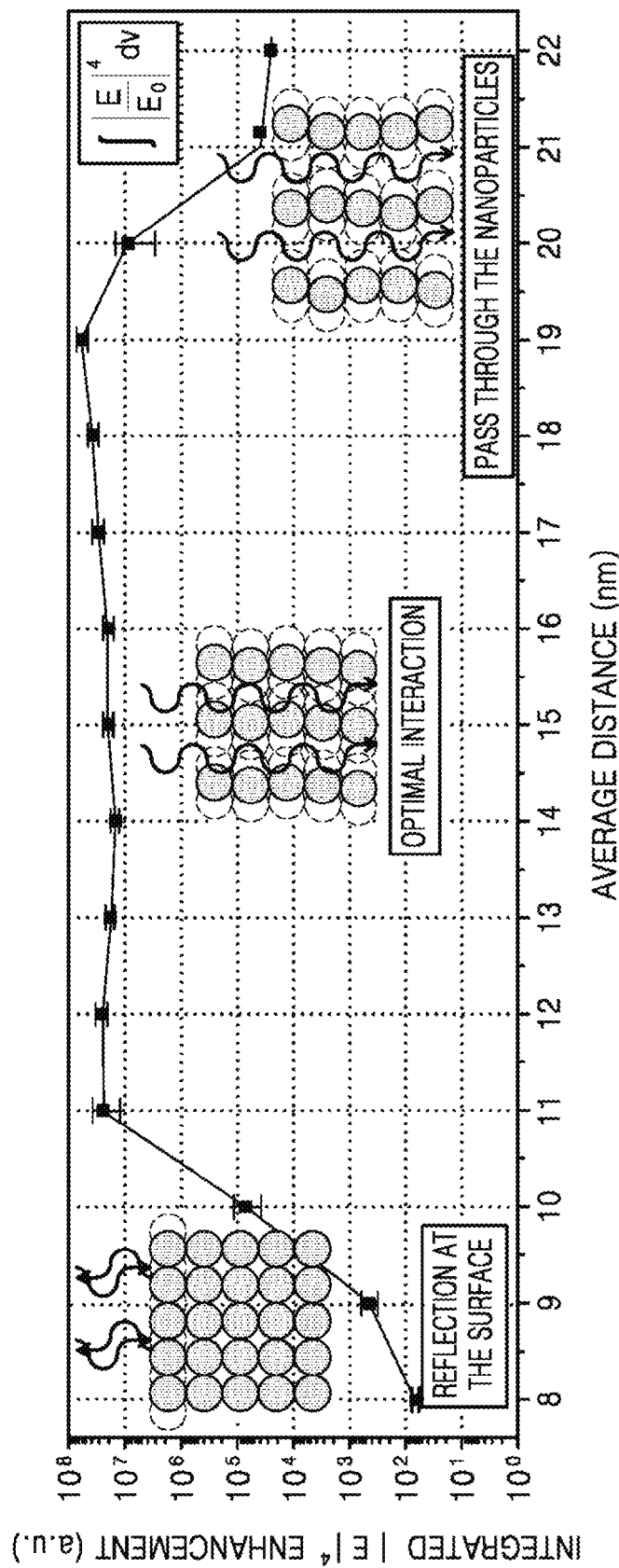
FIG. 8 is a graph showing a surface-enhanced effect according to a mean interval between a plurality of metal nanoparticle clusters in a substrate for sensing, according to an exemplary embodiment.

In addition, the surface-enhanced effect of the substrate 10 for sensing according to the present exemplary embodiment may also vary according to the size of the perforations 15 or the intervals among the plurality of metal nanoparticle clusters 14. FIG. 8 is a graph showing a surface-enhanced effect according to a mean interval between adjacent ones of the plurality of metal nanoparticle clusters 14 in the substrate 10 for sensing, according to an exemplary embodiment. The graph of FIG. 8 is a result of simulating a surface-enhanced effect formed between the metal nanoparticle clusters 14 while changing the mean interval between adjacent ones of the plurality of metal nanoparticle clusters 14 from 8 nm to 22 nm by assuming a diameter of each metal nanoparticle 13 formed of Au is 14 nm. Herein, it is assumed that a standard deviation σ of the mean interval between adjacent ones of the metal nanoparticle clusters 14 is 7 nm.

Referring to FIG. 8, when the mean interval between adjacent ones of the metal nanoparticle clusters 14 is too small, the surface-enhanced effect is lowered due to a loss of light to reflection. When the mean interval between adjacent ones of the metal nanoparticle clusters 14 is too large, light is transmitted without exciting sufficient numbers of the metal nanoparticles 13, thereby lowering the surface-enhanced effect. When the mean interval between adjacent ones of the metal nanoparticle clusters 14 is appropriate, there is an optimal interaction between light and the metal nanoparticles 13, and most of the light excites the metal nanoparticles 13. For example, when the mean interval between adjacent ones of the plurality of metal nanoparticle clusters 14 is 8 nm to 20 nm, the surface-enhanced effect may be optimal.

Figure 9:
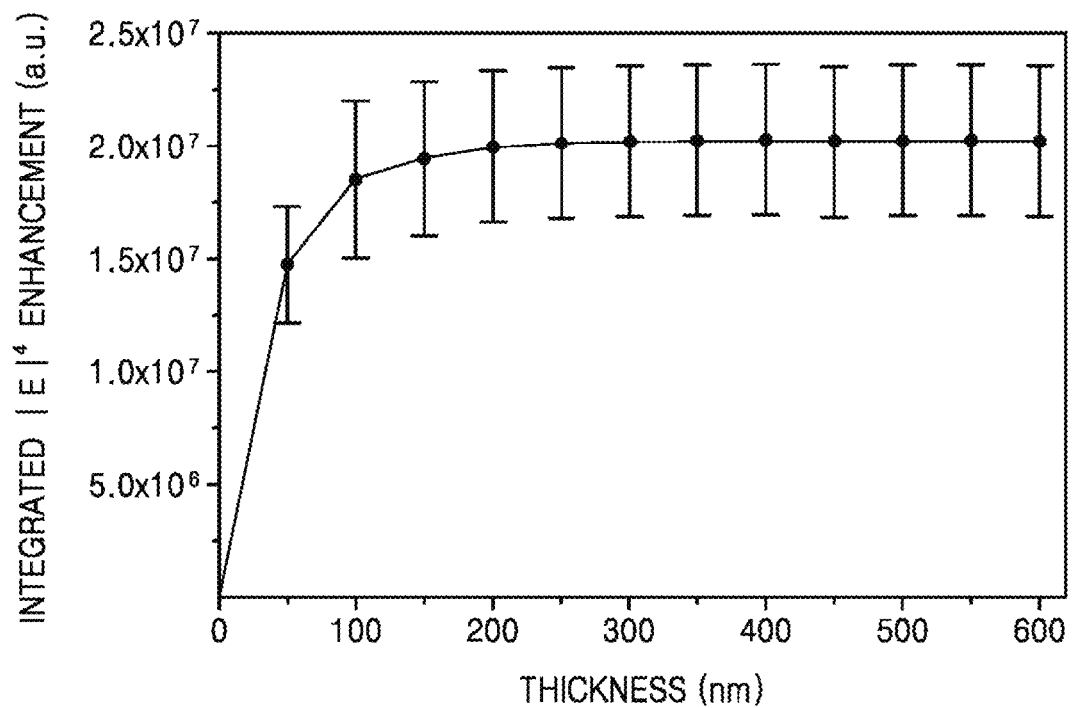
FIG. 9 is a graph showing a surface-enhanced effect according to a thickness of metal nanoparticle clusters in a substrate for sensing, according to an exemplary embodiment.

In addition, the surface-enhanced effect of the substrate 10 for sensing according to the present exemplary embodiment may also vary according to the length of the perforations 15 through which the light is transmitted or according to a thickness of the metal nanoparticle clusters 14. FIG. 9 is a graph showing a surface-enhanced effect according to a thickness of the metal nanoparticle clusters 14 in a substrate 10 for sensing, according to an exemplary embodiment. The graph of FIG. 9 is a result of simulating a surface-enhanced effect formed between the metal nanoparticle clusters 14 while varying the thickness the metal nanoparticle clusters 14 from 0 nm to 600 nm and assuming that a diameter of each metal nanoparticle 13 formed of Au is 14 nm, that a mean interval between adjacent ones of the metal nanoparticle clusters 14 is 15 nm, and that a standard deviation σ of the mean interval between adjacent ones of the metal nanoparticle clusters 14 is 7 nm. Referring to FIG. 9, the surface-enhanced effect increases until the thickness of the metal nanoparticle clusters 14 is about 300 nm, and thereafter, the surface-enhanced effect is saturated. Therefore, the thickness of the plurality of metal nanoparticle clusters 14 may be selected to be between 50 nm and 1 μm.

Figure 10:
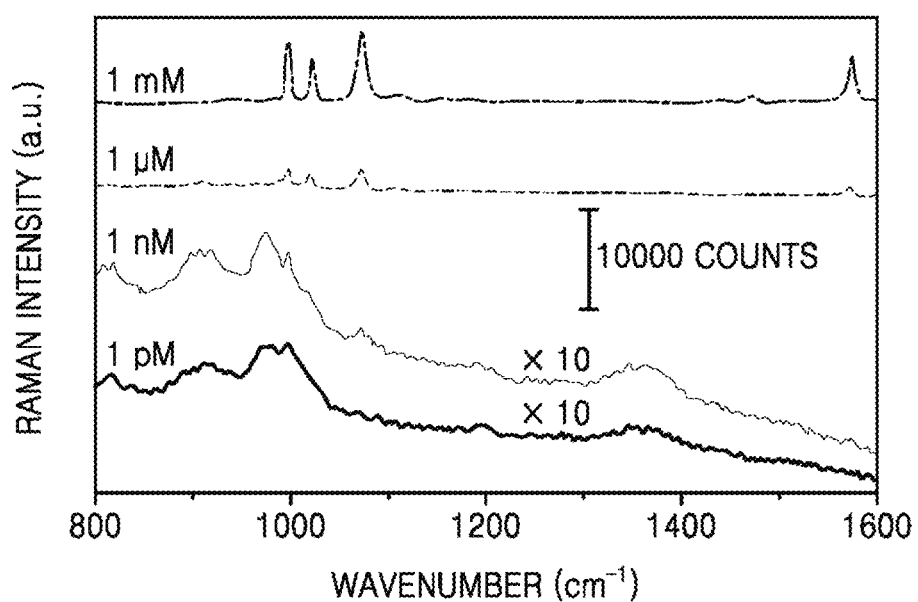
FIG. 10 is a graph showing Raman spectra of various concentrations of samples in a substrate for sensing, according to an exemplary embodiment.

FIG. 10 is a graph showing Raman spectra of various concentrations of samples in a substrate 10 for sensing, according to an exemplary embodiment. For example, measurements are performed by using benzenethiol solutions of which concentrations are 1 mM, 1 μM, 1 nM, and 1 pM, respectively, as sample solutions and using Au as the metal nanoparticles 13. Referring to the graph of FIG. 10, Raman spectra for all concentrations may be clearly seen. Particularly, peaks formed at a certain wavenumber for all concentrations may be seen.

Figure 11:
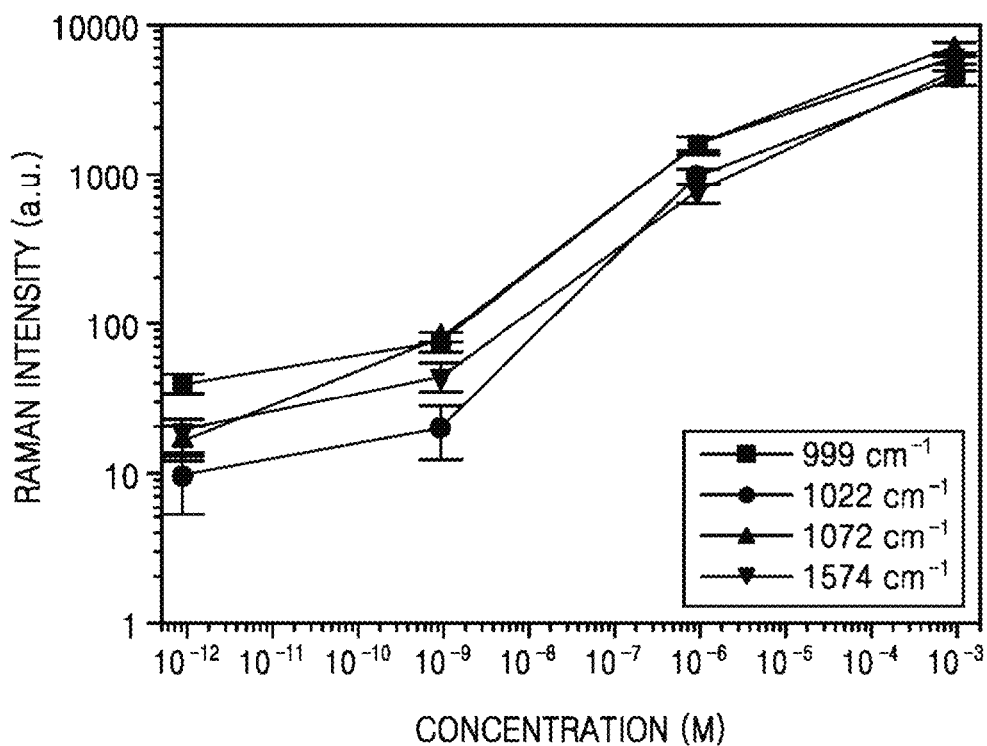
FIG. 11 is a graph showing, for different wavenumbers, an intensity of Raman scattered light according to concentrations of samples in a substrate for sensing, according to an exemplary embodiment.

FIG. 11 is a graph, for different wavenumbers, of an intensity of Raman scattered light according to concentrations of samples in a substrate 10 for sensing, according to an exemplary embodiment. For example, intensities of Raman scattered light for wavenumbers of about 999 $cm^{-1}$, 1022 $cm^{-1}$, 1072 $cm^{-1}$, and 1574 $cm^{-1}$ while changing a concentration of a benzenethiol solution are measured. Referring to the graph of FIG. 11, as the concentration of the benzenethiol solution increases, the intensities of Raman scattered light for all the wavenumbers increase.

Figure 12:
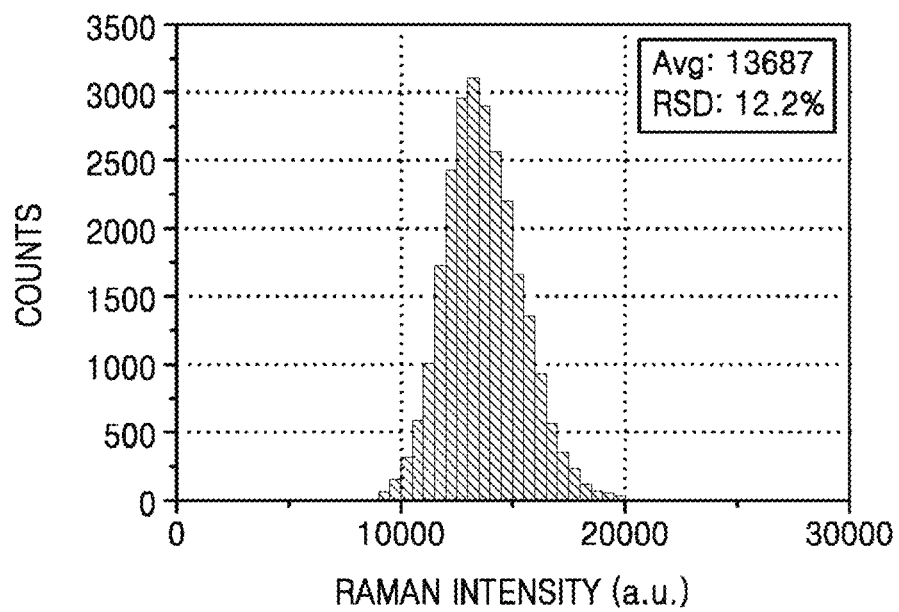
FIG. 12 is a graph showing an intensity distribution of a peak of about 1072 $cm^{-1}$ in a substrate for sensing, according to an exemplary embodiment.

According to the present exemplary embodiment, since a plurality of dense metal nanoparticle clusters 14 may be formed uniformly, substrates for sensing may be relatively simply manufactured on a large-area wafer. FIG. 12 is a graph showing an intensity distribution of a peak of about 1072 $cm^{-1}$ in a substrate 10 for sensing, according to an exemplary embodiment. In the example of FIG. 12, a substrate 10 for sensing is manufactured on a Si wafer having a four-inch diameter. In other words, metal clusters 14 formed of Au are formed on the support layer 11 formed of a Si wafer having a four-inch diameter. By using this substrate 10 for sensing, an intensity of a peak formed in a wavenumber of about 1072 $cm^{-1}$ for a benzenethiol solution of which a concentration is 1 mM is repetitively measured, and a distribution thereof is seen. Referring to FIG. 12, peak intensities in the wavenumber of about 1072 $cm^{-1}$ are distributed in a relatively narrow region. Therefore, since substrates for sensing 10 may be uniformly manufactured on a four-inch wide-area wafer, the manufacturing cost of each substrate 10 for sensing may be lowered.

Figure 13:
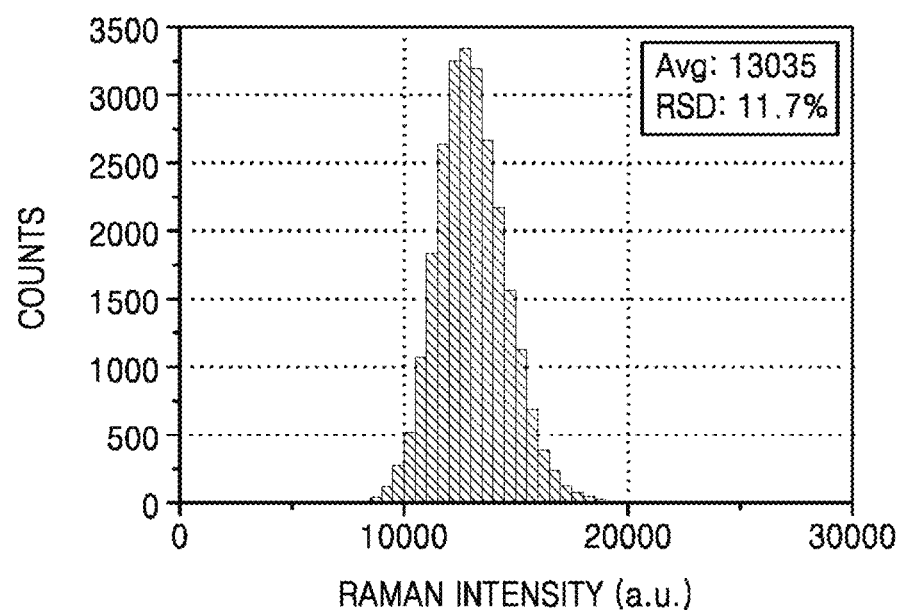
FIG. 13 is a graph showing an intensity distribution of a peak of about 999 $cm^{-1}$ in a substrate for sensing manufactured on a four-inch wafer.
Figure 14:
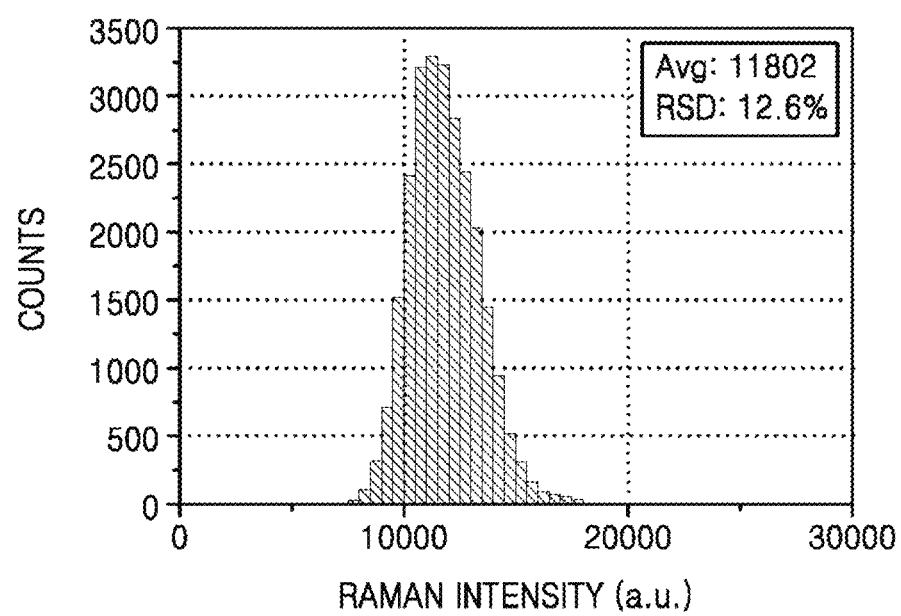
FIG. 14 is a graph showing an intensity distribution of a peak of about 1022 $cm^{-1}$ in a substrate for sensing manufactured on a four-inch wafer.
Figure 15:
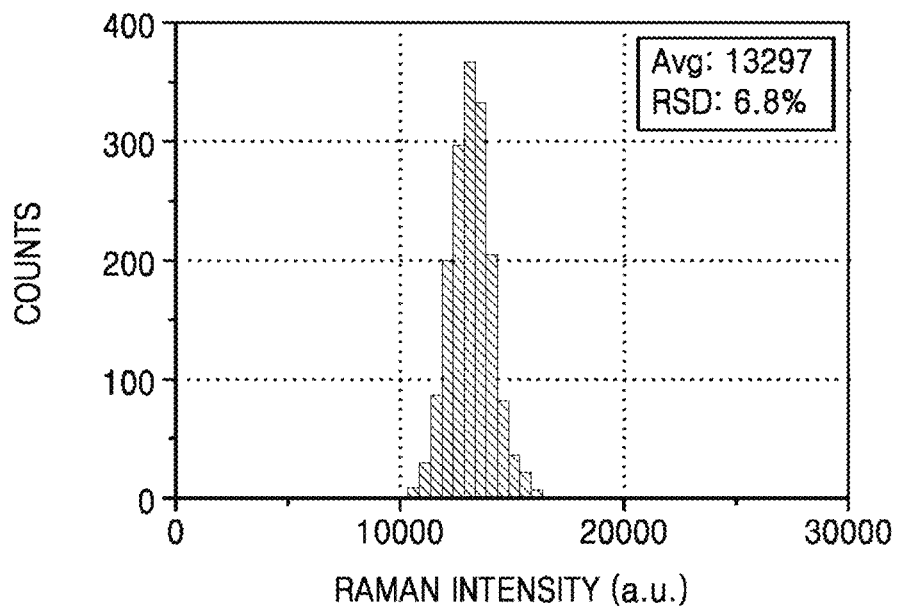
FIG. 15 is a graph showing an intensity distribution of a peak of about 1072 $cm^{-1}$ in a substrate for sensing manufactured on a wafer of a size of 4×4 $mm^2$.

In addition, FIG. 13 is a graph showing an intensity distribution of a peak of about 999 $cm^{-1}$ in a substrate 10 for sensing manufactured on a four-inch wafer, FIG. 14 is a graph showing an intensity distribution of a peak of about 1022 $cm^{-1}$ in a substrate 10 for sensing manufactured on a four-inch wafer, and FIG. 15 is a graph showing an intensity distribution of a peak of about 1072 $cm^{-1}$ in a substrate 10 for sensing manufactured on a wafer of a size of 4×4 $mm^2$. In the examples of FIGS. 13 to 15, a benzenethiol solution of which a concentration is 1 mM is used as a sample. Referring to the graphs of FIGS. 13 and 14, relatively uniform characteristics are seen even for the peak of about 999 $cm^{-1}$ and the peak of about 1022 $cm^{-1}$. Particularly, referring to the graph of FIG. 15, as a size of a wafer is small, uniformity further increases, and thus peak intensities are distributed in a very narrow region, thereby significantly reducing a relative standard deviation (RSD).

Figure 16:
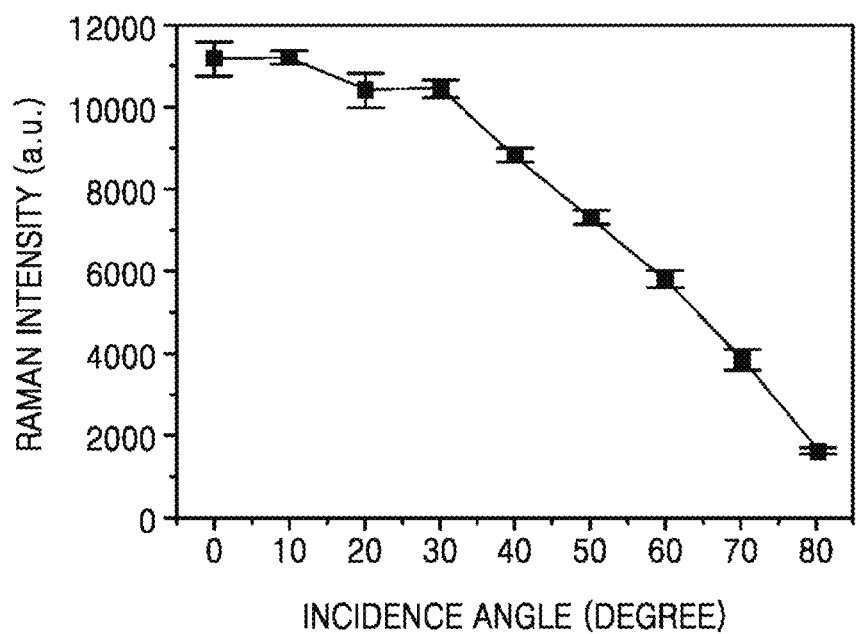
FIG. 16 is a graph showing a relationship between an angle of incident light and an intensity of Raman scattered light in the substrate for sensing, according to an exemplary embodiment.

FIG. 16 is a graph showing a relationship between an angle of incident light and an intensity of Raman scattered light in a substrate 10 for sensing, according to an exemplary embodiment. In the example of FIG. 16, a benzenethiol solution of which a concentration is 1 mM is used as a sample, and the angle of the incident light is changed from 0° to 80°. Herein, the angle of the incident light is measured with respect to a surface of the substrate 10 for sensing. That is, an incident angle of light which is incident at an angle normal to a surface of the substrate 10 for sensing is 0°. As shown in the graph of FIG. 16, as the incident angle increases, the intensity of Raman scattered light decreases.

Figure 17:
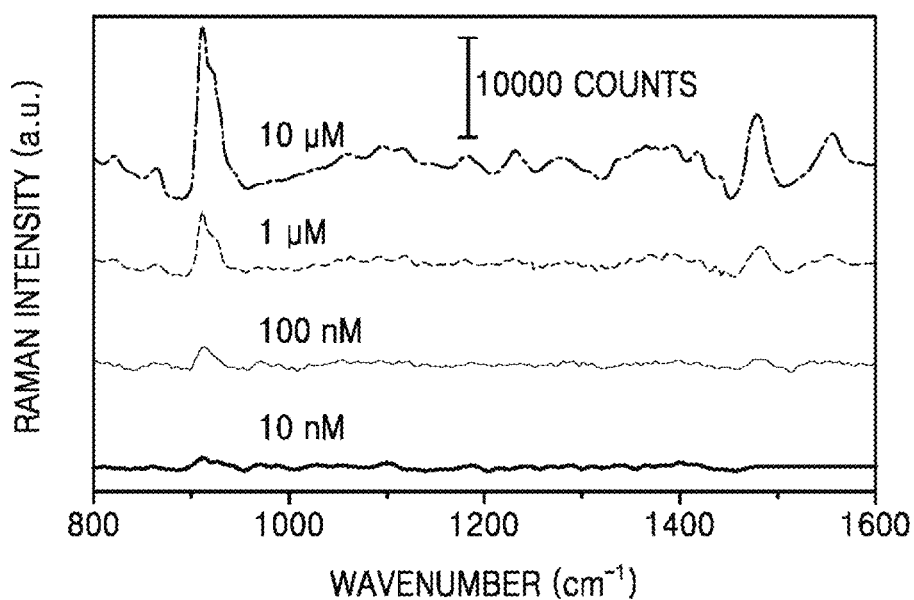
FIG. 17 is a graph showing Raman spectra of various concentrations of other samples in the substrate for sensing, according to an exemplary embodiment.

FIG. 17 is a graph showing Raman spectra of various concentrations of other samples in a substrate 10 for sensing, according to an exemplary embodiment. In the example of FIG. 17, adenine solutions of which concentrations are respectively 10 µM, 1 µM, 100 nM, and 10 nM are used as samples. Referring to the graph of FIG. 17, as an intensity of a sample increases, an intensity of Raman scattered light increases, and a peak in a certain wavenumber may also be seen.

Figure 18:
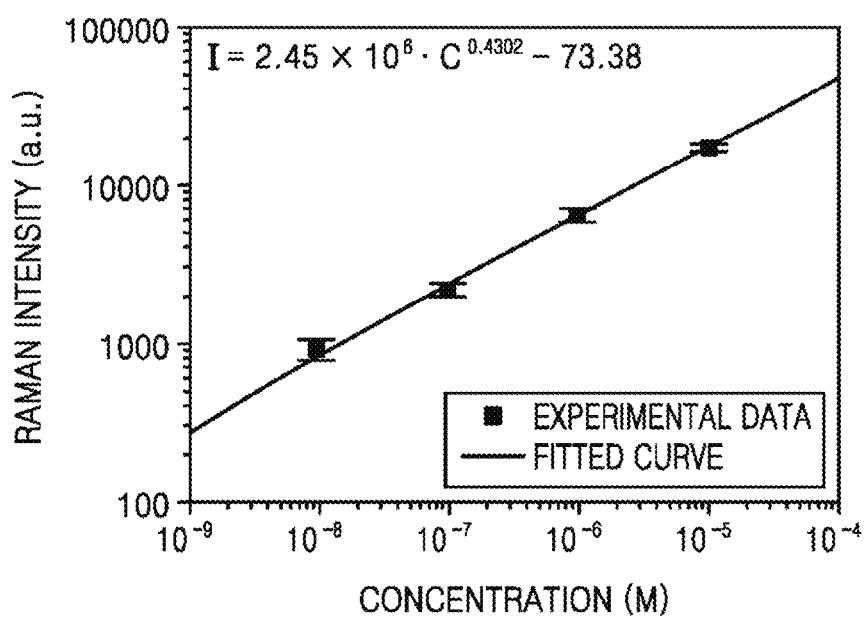
FIG. 18 is a graph showing a relationship between sample concentration and intensity of Raman scattered light in a substrate for sensing, according to an exemplary embodiment.
Figure 19:
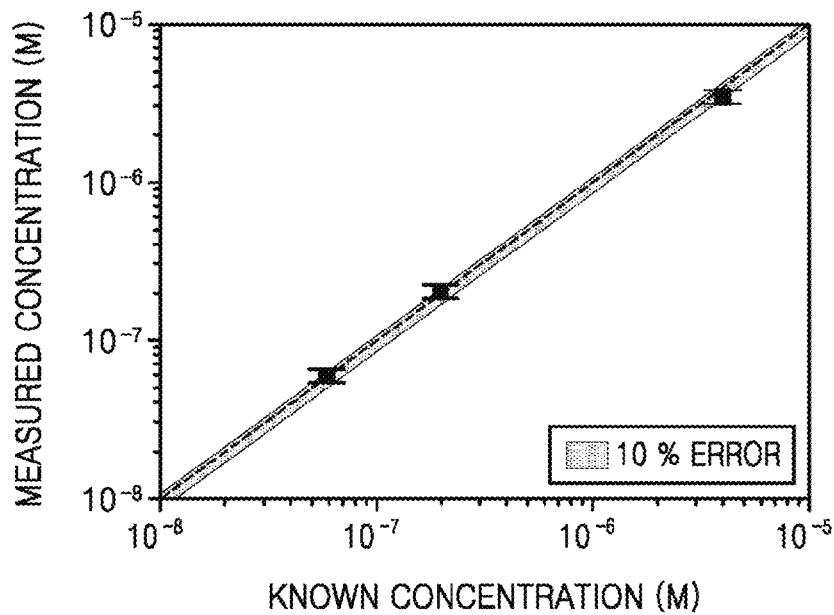
FIG. 19 is a graph showing a result of measuring a sample concentration by using a substrate for sensing, according to an exemplary embodiment.

FIG. 18 is a graph showing a relationship between sample concentration and intensity of Raman scattered light in a substrate 10 for sensing, according to an exemplary embodiment, and FIG. 19 is a graph showing a result of measuring a sample concentration by using a substrate 10 for sensing, according to an exemplary embodiment. Referring to the graph of FIG. 18, the sample concentration and the intensity of Raman scattered light are almost proportional to each other. In addition, referring to the graph of FIG. 19, a concentration of an adenine solution sample may be correctly measured by using the result of FIG. 18.

It has been described that a substrate 10 for sensing may be manufactured by forming, on the support layer 11, nanowires 12 formed of a material different from that of the support layer 11, and by forming metal nanoparticles 13 on the surfaces of the nanowires 12. However, alternately, nanowires or similar structures may be formed by etching the support layer 11.

Figure 20:
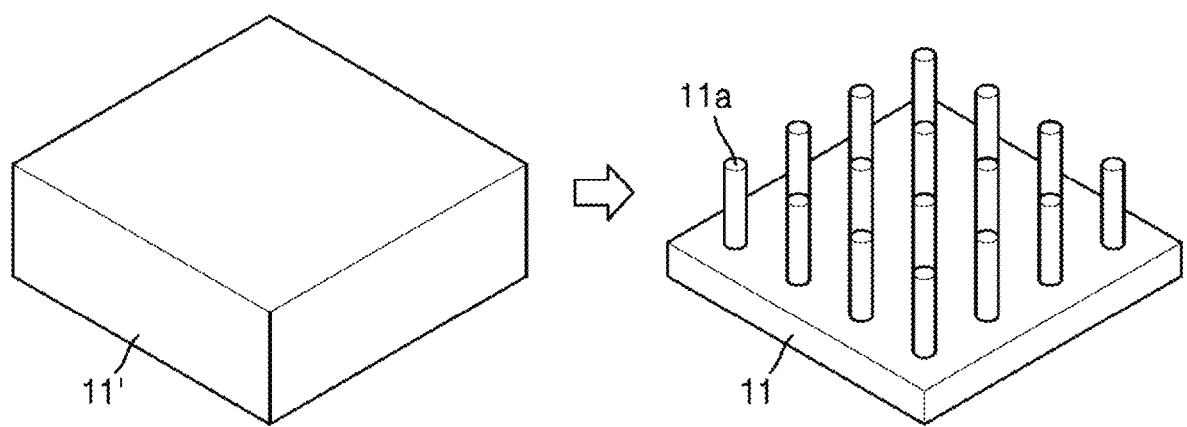
FIG. 20 is a schematic perspective view showing a method of manufacturing a substrate for sensing, according to another exemplary embodiment.

For example, FIG. 20 is a schematic perspective view showing a method of manufacturing a substrate 10 for sensing, according to another exemplary embodiment. Referring to FIG. 20, the support layer 11 and a plurality of nanowires 11a formed thereon may be formed by selectively etching an upper surface of a support layer material 11'. In this case, the support layer 11 and the plurality of nanowires 11a are formed of the same material and may be formed at the same time. Thereafter, as shown in FIGS. 1A to 1E, a plurality of metal nanoparticle clusters 14 including a plurality of conductive metal nanoparticles 13 stacked in a three-dimensional structure may be formed by depositing the plurality of conductive metal nanoparticles 13 on the surfaces of the nanowires 11a. The plurality of nanowires 11a may be dissolved in the operations of forming the metal nanoparticle clusters 14 or may be removed after forming the metal nanoparticle clusters 14. In this case, a thickness of the support layer 11 may be much larger than a diameter of the nanowires 11a such that the support layer 11 is not removed.

Figure 21:
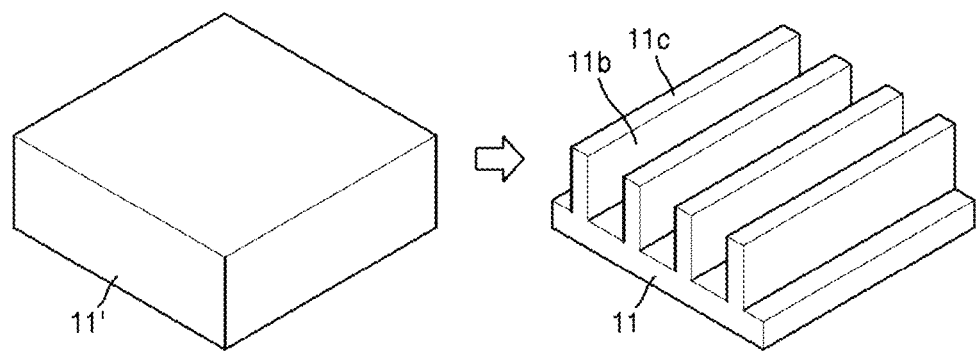
FIG. 21 is a schematic perspective view showing a method of manufacturing a substrate for sensing, according to another exemplary embodiment.

In addition, FIG. 21 is a schematic perspective view showing a method of manufacturing a substrate 10 for sensing, according to another exemplary embodiment. Referring to FIG. 21, a plurality of parallel trenches 11b may be formed by etching an upper surface of the support layer material 11' in the form of a plurality of parallel straight lines. In this way, the support layer 11 and walls 11c, formed thereon in the form of a plurality of parallel planes, may be formed. Thereafter, as shown in FIGS. 1B to 1E, a plurality of metal nanoparticle clusters 14 including a plurality of conductive metal nanoparticles 13 stacked in a three-dimensional structure may be formed by depositing the plurality of conductive metal nanoparticles 13 on the plurality of walls 11c. The plurality of walls 11c may be dissolved in the operations of forming the metal nanoparticle clusters 14 or may be removed after forming the metal nanoparticle clusters 14. In this case, perforations 15, which are openings in the form of slits formed by the removal of the walls 11c, may be formed in the form of a plurality of parallel straight lines.

This manufactured substrate 10 for sensing may be used as, for example, an SERS substrate but its use is not limited thereto. The substrate 10 for sensing may be variously applied to any of various optical measurement methods. For example, the substrate 10 for sensing may be applied to fluorescence-based spectroscopy. In addition, since the substrate 10 for sensing has a high light absorption ratio, the substrate 10 for sensing may also be applied to a solar cell and an anti-reflective film. In addition, by using the substrate 10 for sensing according to the present exemplary embodiment, a disposable, wearable, handheld, implantable, or desktop sensing platform may be implemented.

Figure 22:
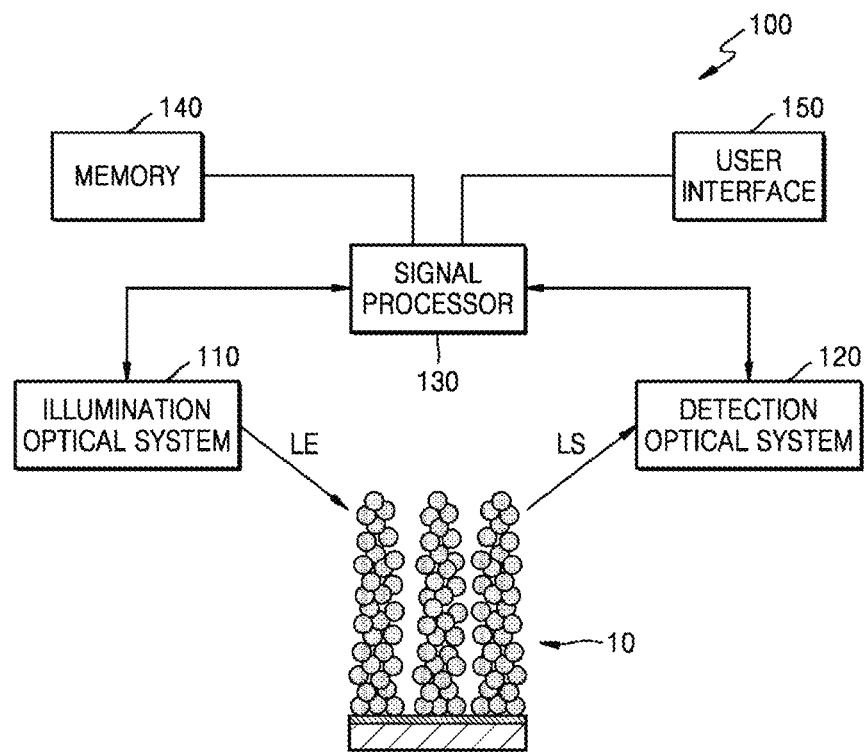
FIG. 22 is a block diagram of an analyzing apparatus including a substrate for sensing, according to an exemplary embodiment.

For example, FIG. 22 is a block diagram of an analyzing apparatus 100 including a substrate 10 for sensing, according to an exemplary embodiment. Referring to FIG. 22, the analyzing apparatus 100 according to an exemplary embodiment may include an illumination optical system 110 including a light source that emits excitation light LE onto the substrate 10 for sensing, a detection optical system 120 including an optical detector that detects light LS scattered from the substrate 10 for sensing, and a signal processor 130 that analyzes a property of a substance of an object by using an signal output from the detection optical system 120. Although not shown, the object may be disposed on the substrate 10 for sensing. The signal processor 130 may analyze a property of a substance of the object by analyzing an intensity and a spectrum of the light LS scattered from the substrate 10 for sensing. The signal processor 130 may be configured to control an operation of the detection optical system 120 according to circumstances.

In addition, the analyzing apparatus 100 may further include a memory 140 that stores a program, data, and the like used for the processing of the signal processor 130 and a user interface 150 that provides a result analyzed by the signal processor 130 to a user. Although not shown, the analyzing apparatus 100 may further include an amplifier that amplifies a signal detected by the detection optical system 120.

The analyzing apparatus 100 may be a biometric information analyzing apparatus that measures and analyzes a biometric component by a non-invasive method. For example, the analyzing apparatus 100 may analyze substances included in tissue or blood of the object or components thereof. Raman spectroscopy may be used to analyze a property of a substance of the object.

Raman spectroscopy takes advantage of the phenomenon by which an energy state is shifted when light of a single wavelength is scattered through an interaction with molecular vibrations of substances forming an object. The excitation light LE emitted from the illumination optical system 110 is scattered by a molecular structure in the object and is output from the object in the form of wavelength-converted scattered light LS. The scattered light LS, i.e., a biometric optical signal, includes various spectra of which wavelength-converted degrees are different according to molecular states of the object. A detected Raman signal includes a wavelength shift moved from a wavelength of incident light, and the wavelength shift may include information related to molecular vibrations of a substance, e.g., information regarding a molecular structure, a bonding shape, and the like, and may include information regarding a functional group.

According to a molecular component of the object, a Raman peak on a Raman spectrum appears differently. For example, the intercellular fluid or blood of a patient (i.e. the object) may include glucose, urea, ceramide, keratin, collagen, and the like. Glucose, for example, may have Raman shift values corresponding to wavenumbers of about 436.4 $cm^{-1}$, 1065 $cm^{-1}$, 1126.4 $cm^{-1}$, 525.7 $cm^{-1}$. In addition, collagen may exhibit Raman shifts of about 855 $cm^{-1}$ and 936 $cm^{-1}$. In addition, urea may exhibit a Raman shift of about 1000 $cm^{-1}$.

The signal processor 130 may obtain a distribution amount of each substance from the intensity of a spectral peak at a point at which a wavelength is shifted by the Raman shift corresponding to each substance, from a wavelength of the excitation light LE. For example, if the intensity of spectrum peaks is high at positions at which a wavelength is shifted, from a wavenumber of incident light, by wavenumbers of about 436.4 $cm^{-1}$, 1065 $cm^{-1}$, 1126.4 $cm^{-1}$, 525.7 $cm^{-1}$, this may indicate that the distribution amount of glucose is large. In addition, if the intensity of spectrum peaks is high at positions at which a wavelength is shifted, from the wavenumber of the incident light by wavenumbers of about 855 $cm^{-1}$ and 936 $cm^{-1}$, this may indicate that the distribution amount of collagen is large.

The signal processor 130 may analyze distribution amounts of substances included in the skin of a patient (the object) from a Raman signal as described above and may thereby diagnose a health state of the patient. The substrate 10 for sensing may improve detection sensitivity of the analyzing apparatus 100 by enhancing a magnitude of the scattered light LS output from the object.

In addition, the signal processor 130 may generate a control signal used to control a general operation of the analyzing apparatus 100. The signal processor 130 may process an analyzed result as an image signal such that the analyzed result is displayed on a display of the user interface 150. In addition, the signal processor 130 may transmit a control signal to the illumination optical system 110 and the detection optical system 120 according to an input from the user interface 150. The signal processor 130 may be implemented by a microprocessor or the like.

The user interface 150 is an interface between the analyzing apparatus 100 and the user and/or other external equipment and may include an input unit and a display.

The memory 140 may store a program for processing and controlling the signal processor 130 and may store input/output data. For example, the memory 140 may store a lookup table of correlations between spectral peak values and amounts of substances, to enable the signal processor to quantitatively determine an amount of a substance from an intensity of a Raman spectral peak.

The memory 140 may include at least one type of storage medium from among a flash memory type memory, a hard disk type memory, a multimedia card micro type memory, a card type memory (e.g., a secure digital (SD) or extreme digital (XD) memory), a random access memory (RAM), a read-only memory (ROM), an electrically erasable programmable read-only memory (EEPROM), a programmable read-only memory (PROM), a magnetic memory, a magnetic disc, and an optical disc, as well as another type of memory as would be understood by one of skill in the art.

Besides, the analyzing apparatus 100 may further include a communication interface. For example, an analyzed result may be transmitted to other external equipment through the communication interface. The external equipment may be medical equipment using analyzed biometric information, a printer for printing a result, or a display apparatus that displays an analysis result. Furthermore, the external equipment may be a smartphone, a cellular phone, a personal digital assistant (PDA), a laptop computer, a personal computer (PC), a wearable device, or another mobile or non-mobile computing device and is not limited thereto.

An apparatus according to the exemplary embodiments may include a processor, a memory for storing and executing program data, a permanent storage such as a disk drive, a communication port for communicating with an external device, and a user interface, such as a touch panel, a key, and a button. Methods implemented via a software module or an algorithm may be stored in a non-transitory computer-readable recording medium in the form of computer-readable codes or program instructions executable in the processor. Examples of the computer-readable recording medium include magnetic storage media (e.g., ROM, RAM, floppy disks, hard disks, etc.) and optical recording media (e.g., CD-ROMs, digital versatile discs (DVDs), etc.). The computer-readable recording medium can also be distributed over network coupled computer systems so that the computer-readable code is stored and executed in a distributed fashion. The media can be read by a computer, stored in the memory, and executed by the processor.

While the substrate for sensing, the method of manufacturing the substrate, and the analysing apparatus including the substrate have been described with reference to exemplary embodiments shown in the drawings, it will be understood by those of ordinary skill in the art that various changes and equivalent other embodiments may be made therefrom. Therefore, the exemplary embodiments should be considered in a descriptive sense only and not for purposes of limitation. The scope is defined not by the detailed description but by the appended claims, and all differences within the scope will be construed as being included therein.

What is claimed is:

1. A substrate for sensing, comprising:
a support layer;
a seed layer on the support layer;

a plurality of metal nanoparticle clusters arranged on the seed layer, each of the plurality of metal nanoparticle clusters comprising a plurality of conductive metal nanoparticles, and the plurality of conductive metal nanoparticles being stacked in a three-dimensional structure; and a plurality of perforations arranged at regular intervals among the plurality of metal nanoparticle clusters, wherein each of the plurality of perforations transmits incident light therethrough such that the light excites conductive metal nanoparticles between an upper part of each of the plurality of metal nanoparticle clusters and a lower part of each of the plurality of metal nanoparticle clusters while the light is transmitted along each of the plurality of perforations, wherein the plurality of perforations are separated from each other, and wherein a mean size of each perforation from among the plurality of perforations defined by a mean interval between adjacent ones of the plurality of metal nanoparticle clusters is 8 nm to 20 nm.

2. The substrate for sensing of claim 1, wherein the support layer comprises a semiconductor wafer.

3. The substrate for sensing of claim 1, wherein the plurality of conductive metal nanoparticles comprise at least one conductive metal selected from gold (Au), silver (Ag), copper (Cu), and aluminum (Al).

4. The substrate for sensing of claim 1, wherein each of the plurality of metal nanoparticle clusters extends vertically from a surface of the seed layer.

5. The substrate for sensing of claim 4, wherein a thickness of each of the plurality of metal nanoparticle clusters is 50 nm to 1 µm.

6. The substrate for sensing of claim 1, wherein each of the plurality of perforations extend to a surface of the seed layer, such that each of the plurality of perforations transmits incident light to the surface of the seed layer.

7. The substrate for sensing of claim 1, wherein a mean diameter of the plurality of conductive metal nanoparticles is 10 nm to 20 nm.

8. An analyzing apparatus comprising the substrate for sensing of claim 1.

9. The substrate for sensing of claim 1, wherein each perforation from among the plurality of perforations is positioned in a space remaining after a respective nanowire from among a plurality of nanowires has been dissolved during arrangement of the respective metal nanoparticle cluster.

* * * * *